US012593519B2

(12) United States Patent
Huang et al.

(10) Patent No.: US 12,593,519 B2
(45) Date of Patent: Mar. 31, 2026

(54) BACKSIDE ILLUMINATED IMAGE SENSOR STRUCTURE INCLUDING LIGHT PIPE STRUCTURE AND MANUFACTURING METHOD THEREOF

(71) Applicant: Powerchip Semiconductor Manufacturing Corporation, Hsinchu (TW)

(72) Inventors: Yu Ling Huang, Hsinchu City (TW); Yu-Yuan Lai, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 382 days.

(21) Appl. No.: 18/331,957

(22) Filed: Jun. 9, 2023

(65) Prior Publication Data

US 2024/0282798 A1 Aug. 22, 2024

(30) Foreign Application Priority Data

Feb. 21, 2023 (TW) .................................. 112106346

(51) Int. Cl.
*H10F 39/12* (2025.01)
*H10F 39/00* (2025.01)

(52) U.S. Cl.
CPC ......... *H10F 39/199* (2025.01); *H10F 39/024* (2025.01); *H10F 39/8053* (2025.01); *H10F 39/8063* (2025.01); *H10F 39/807* (2025.01)

(58) Field of Classification Search
CPC .. H10F 39/199; H10F 39/024; H10F 39/8053; H10F 39/8063; H10F 39/807; H10F 39/182; H10F 39/8067
See application file for complete search history.

(56) References Cited

U.S. PATENT DOCUMENTS

| | | | |
|---|---|---|---|
| 11,004,887 B2 | 5/2021 | Chiang et al. | |
| 11,094,728 B2 | 8/2021 | Miyata et al. | |
| 2017/0110493 A1 | 4/2017 | Yokogawa | |
| 2019/0165009 A1* | 5/2019 | Wu ........................ | H10F 39/182 |

(Continued)

FOREIGN PATENT DOCUMENTS

| | | |
|---|---|---|
| TW | 201926573 | 7/2019 |
| TW | 202015230 | 4/2020 |

(Continued)

OTHER PUBLICATIONS

"Office Action of Taiwan Counterpart Application", issued on Oct. 5, 2023, pp. 1-10.

(Continued)

*Primary Examiner* — Ratisha Mehta
*Assistant Examiner* — Sophia W Kao
(74) *Attorney, Agent, or Firm* — JCIPRNET

(57) ABSTRACT

A backside illuminated image sensor structure including a pixel structure is provided. The pixel structure includes a substrate, a light sensing device, and at least one light pipe structure. The substrate includes a first surface and a second surface opposite to each other. The second surface has at least one recess. The light sensing device is located in the substrate. The light sensing device is adjacent to the first surface. The light pipe structure is located in the substrate. The light pipe structure is located directly above the light sensing device.

19 Claims, 13 Drawing Sheets

(56)　　　　　　References Cited

U.S. PATENT DOCUMENTS

| | | | | |
|---|---|---|---|---|
| 2021/0366956 A1 * | 11/2021 | Wu | ........................ | H10F 39/811 |
| 2022/0020790 A1 * | 1/2022 | Zang | .................... | H10F 39/8063 |
| 2022/0384495 A1 * | 12/2022 | Wu | ........................ | H10F 39/182 |
| 2023/0317758 A1 * | 10/2023 | Ho | ........................ | H10F 39/024 |
| | | | | 257/432 |

FOREIGN PATENT DOCUMENTS

| | | |
|---|---|---|
| TW | 202209661 | 3/2022 |
| TW | 202218141 | 5/2022 |
| TW | 202234688 | 9/2022 |
| WO | 2018079296 | 5/2018 |

OTHER PUBLICATIONS

I. Oshiyama et al., "Visible Light Sensitivity Enhancement of CMOS Image Sensor with Pseudo High Refractive Index Film Integrated by Directed Self-Assembly Process", 2021 5th IEEE Electron Devices Technology & Manufacturing Conference, Apr. 11, 2021, pp. 1-3.
Shou-Gwo Wuu et al., "A Review of 3-Dimensional Wafer Level Stacked Backside Illuminated CMOS Image Sensor Process Technologies", IEEE Transactions on Electron Devices, Jun. 2022, pp. 2766-2778.

* cited by examiner

BACKSIDE ILLUMINATED IMAGE SENSOR STRUCTURE INCLUDING LIGHT PIPE STRUCTURE AND MANUFACTURING METHOD THEREOF

CROSS-REFERENCE TO RELATED APPLICATION

This application claims the priority benefit of Taiwan application serial no. 112106346, filed on Feb. 21, 2023. The entirety of the above-mentioned patent application is hereby incorporated by reference herein and made a part of this specification.

BACKGROUND

Technical Field

The invention relates to a semiconductor structure and a manufacturing method thereof, and particularly relates to a backside illuminated (BSI) image sensor structure and a manufacturing method thereof.

Description of Related Art

Currently, the BSI image sensor is widely used in many modern electronic devices (e.g., smart phone or digital camera). However, how to further improve the quantum efficiency of the BSI image sensor is the goal of continuous efforts at present.

SUMMARY

The invention provides a BSI image sensor structure and a manufacturing method thereof, which can effectively improve the quantum efficiency of the BSI image sensor structure.

The invention provides a BSI image sensor structure, which includes a pixel structure. The pixel structure includes a substrate, a light sensing device, and at least one light pipe structure. The substrate includes a first surface and a second surface opposite to each other. The second surface has at least one recess. The light sensing device is located in the substrate. The light sensing device is adjacent to the first surface. The light pipe structure is located in the substrate. The light pipe structure is located directly above the light sensing device.

According to an embodiment of the invention, in the BSI image sensor structure, the light pipe structure may extend from the second surface toward the light sensing device.

According to an embodiment of the invention, in the BSI image sensor structure, the light pipe structure may extend from the corresponding recess toward the light sensing device.

According to an embodiment of the invention, in the BSI image sensor structure, the second surface may include an inverted pyramid array (IPA) structure.

According to an embodiment of the invention, in the BSI image sensor structure, the refractive index of the light pipe structure may be less than the refractive index of the substrate.

According to an embodiment of the invention, the BSI image sensor structure may further include a filling layer and a deep trench isolation (DTI) structure. The filling layer fills the recess. The filling layer may be connected to the light pipe structure. The deep trench isolation structure is located in the substrate. The deep trench isolation structure is located aside the light sensing device.

According to an embodiment of the invention, in the BSI image sensor structure, the light pipe structure, the deep trench isolation structure, and the filling layer may be integrally formed.

According to an embodiment of the invention, in the BSI image sensor structure, the bottom of the deep trench isolation structure may be lower than the bottom of the light pipe structure.

According to an embodiment of the invention, in the BSI image sensor structure, the refractive index of the deep trench isolation structure may be less than the refractive index of the substrate.

According to an embodiment of the invention, in the BSI image sensor structure, the light pipe structure includes a filling material layer and a passivation layer. The filling material layer is located in the substrate. The passivation layer is located between the filling material layer and the substrate.

According to an embodiment of the invention, in the BSI image sensor structure, the pixel structure may further include a device layer. The device layer is located on the first surface.

According to an embodiment of the invention, in the BSI image sensor structure, the pixel structure may further include a color filter layer and a microlens layer. The color filter layer is located on the second surface. The microlens layer is located on the color filter layer.

According to an embodiment of the invention, the BSI image sensor structure may include a plurality of the pixel structures. The pixel structures may have the same light pipe structure layout.

According to an embodiment of the invention, the BSI image sensor structure may include a plurality of the pixel structures. The pixel structures may have different light pipe structure layouts.

The invention provides a manufacturing method of a BSI image sensor structure, which includes the following steps. A substrate is provided. The substrate includes a first surface and a second surface opposite to each other. A light sensing device is formed in the substrate. The light sensing device is adjacent to the first surface. At least one recess is formed on the second surface. At least one light pipe structure is formed in the substrate. The light pipe structure is located directly above the light sensing device.

According to an embodiment of the invention, the manufacturing method of the BSI image sensor structure may further include the following steps. A deep trench isolation structure is formed in the substrate. The deep trench isolation structure is located aside the light sensing device. A filling layer is formed in the recess. The filling layer may be connected to the light pipe structure.

According to an embodiment of the invention, in the manufacturing method of the BSI image sensor structure, the method of forming the light pipe structure, the deep trench isolation structure, and the filling layer may include the following steps. At least one first opening is formed in the substrate. The first opening is located directly above the light sensing device. The first opening may be connected to the recess. A second opening is formed in the substrate. The second opening is located aside the light sensing device. A filling material layer is formed on the second surface. The filling material layer may fill the first opening, the second opening, and the recess. The light pipe structure may include a portion of the filling material layer located in the first opening. The deep trench isolation structure may include a portion of the filling material layer located in the second opening. The filling layer may include a portion of the filling material layer located in the recess.

According to an embodiment of the invention, the manufacturing method of the BSI image sensor structure may further include the following steps. A planarization process is performed on the filling material layer.

According to an embodiment of the invention, in the manufacturing method of the BSI image sensor structure, the method of forming the light pipe structure, the deep trench isolation structure, and the filling layer may further include the following steps. A passivation layer is conformally formed on the second surface. The filling material layer may be formed on the passivation layer. The light pipe structure may further include a portion of the passivation layer located in the first opening. The deep trench isolation structure may further include a portion of the passivation layer located in the second opening. The filling layer may further include a portion of the passivation layer located in the recess.

According to an embodiment of the invention, the manufacturing method of the BSI image sensor structure may further include the following step. A device layer is formed on the first surface. A color filter layer is formed on the second surface. A microlens layer is formed on the color filter layer.

Based on the above description, in the BSI image sensor structure and the manufacturing method thereof according to the invention, the substrate includes the first surface and the second surface opposite to each other. The second surface (e.g., backside) has at least one recess. The light sensing device is located in the substrate. The light sensing device is adjacent to the first surface. The light pipe structure is located in the substrate. The light pipe structure is located directly above the light sensing device. Therefore, the quantum efficiency of the BSI image sensor structure can be effectively improved.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 2:
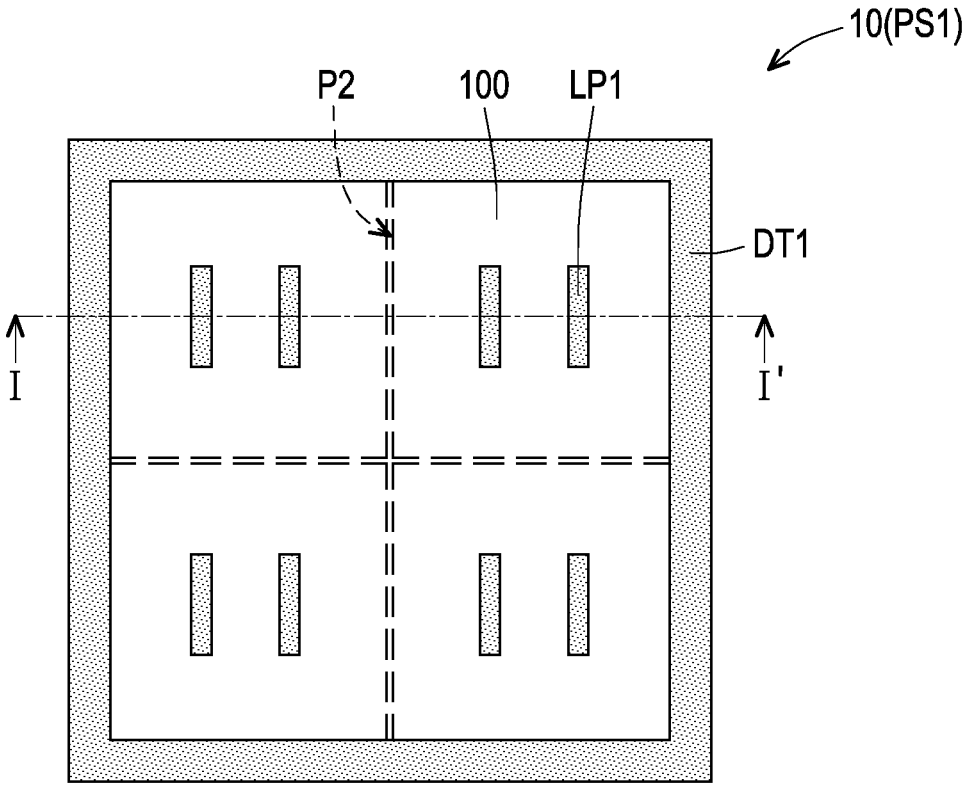
FIG. 2 is a top view of the BSI image sensor structure in FIG. 1H.
Figure 3A:
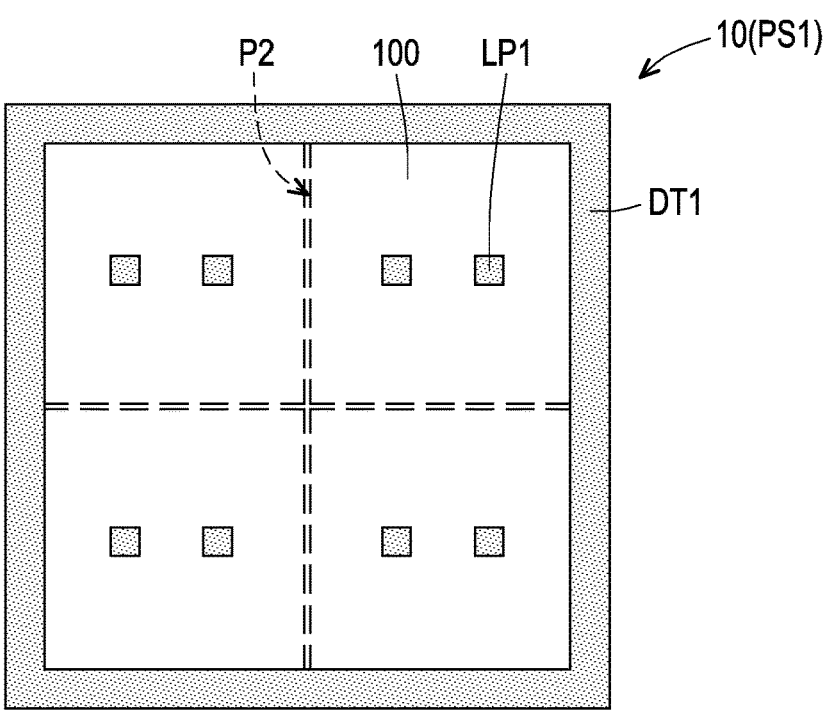
FIG. 3A to FIG. 3F are top views of BSI image sensor structures according to other embodiments of the invention.
Figure 3B:
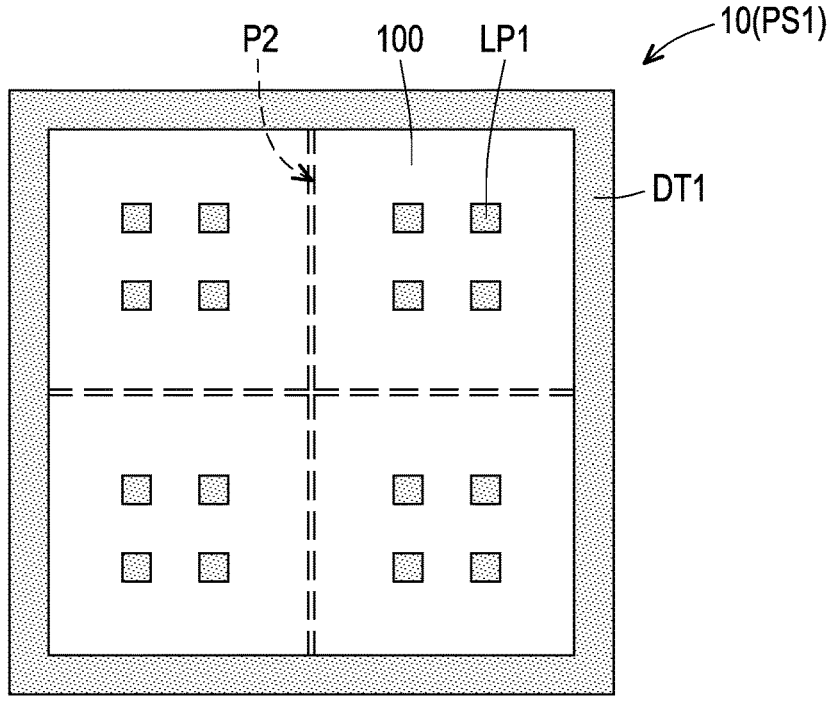
Figure 3C:
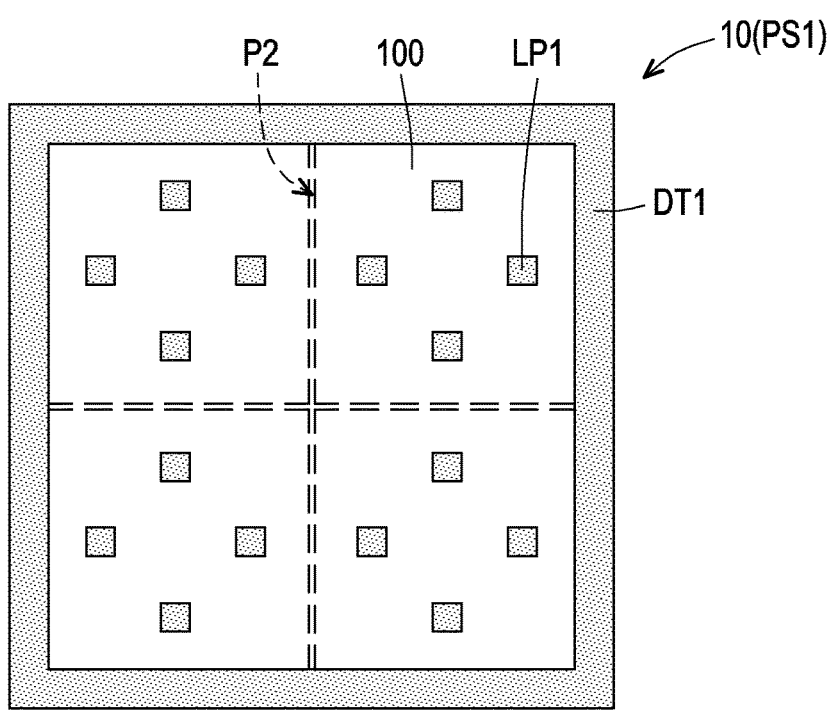
Figure 3D:
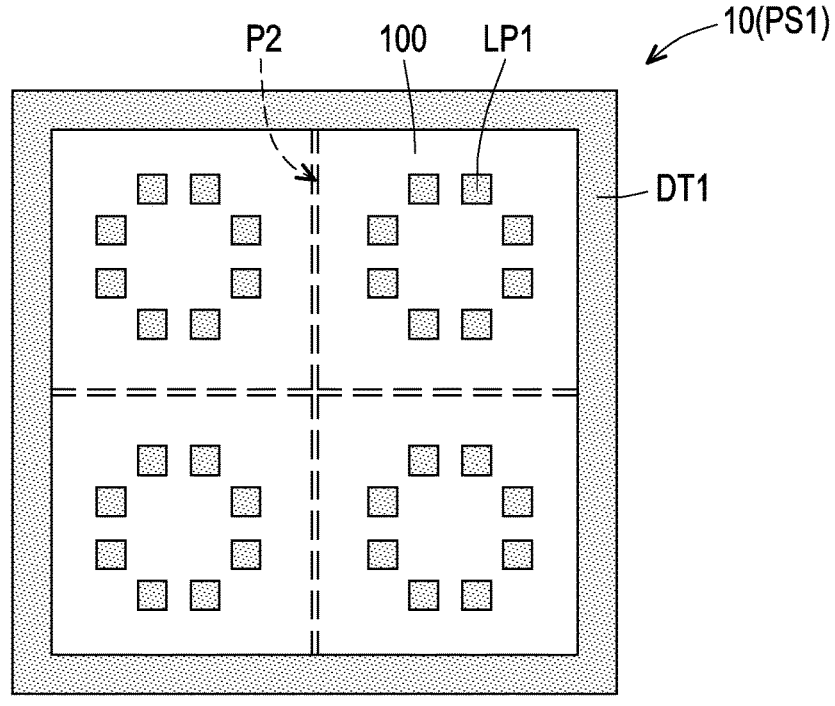
Figure 3E:
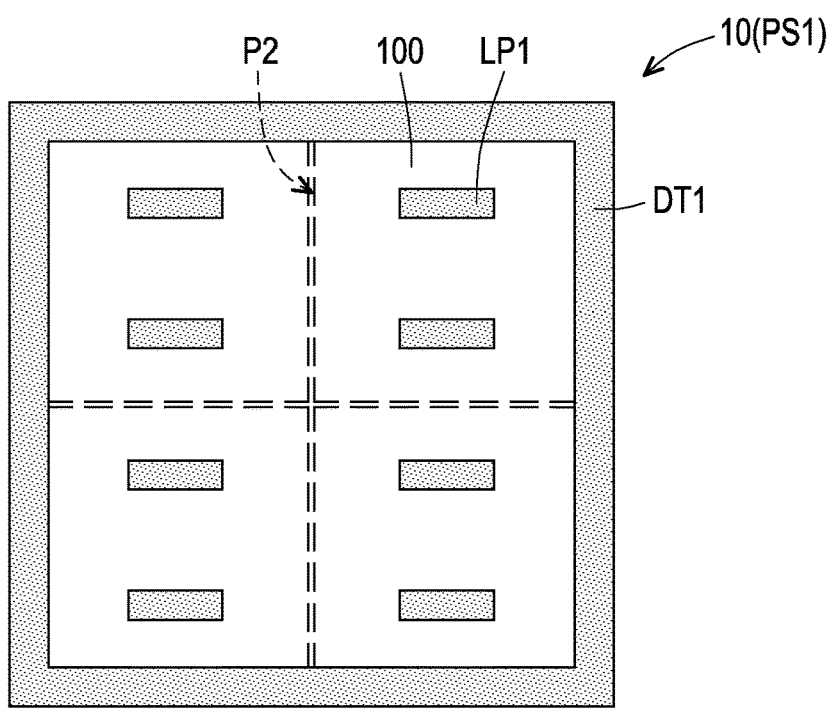
Figure 3F:
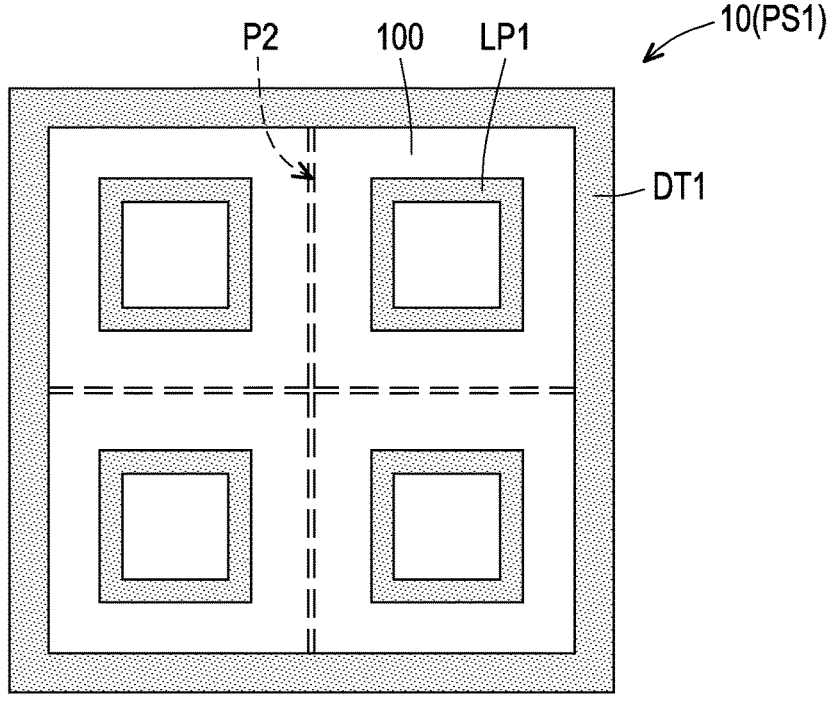
Figure 4:
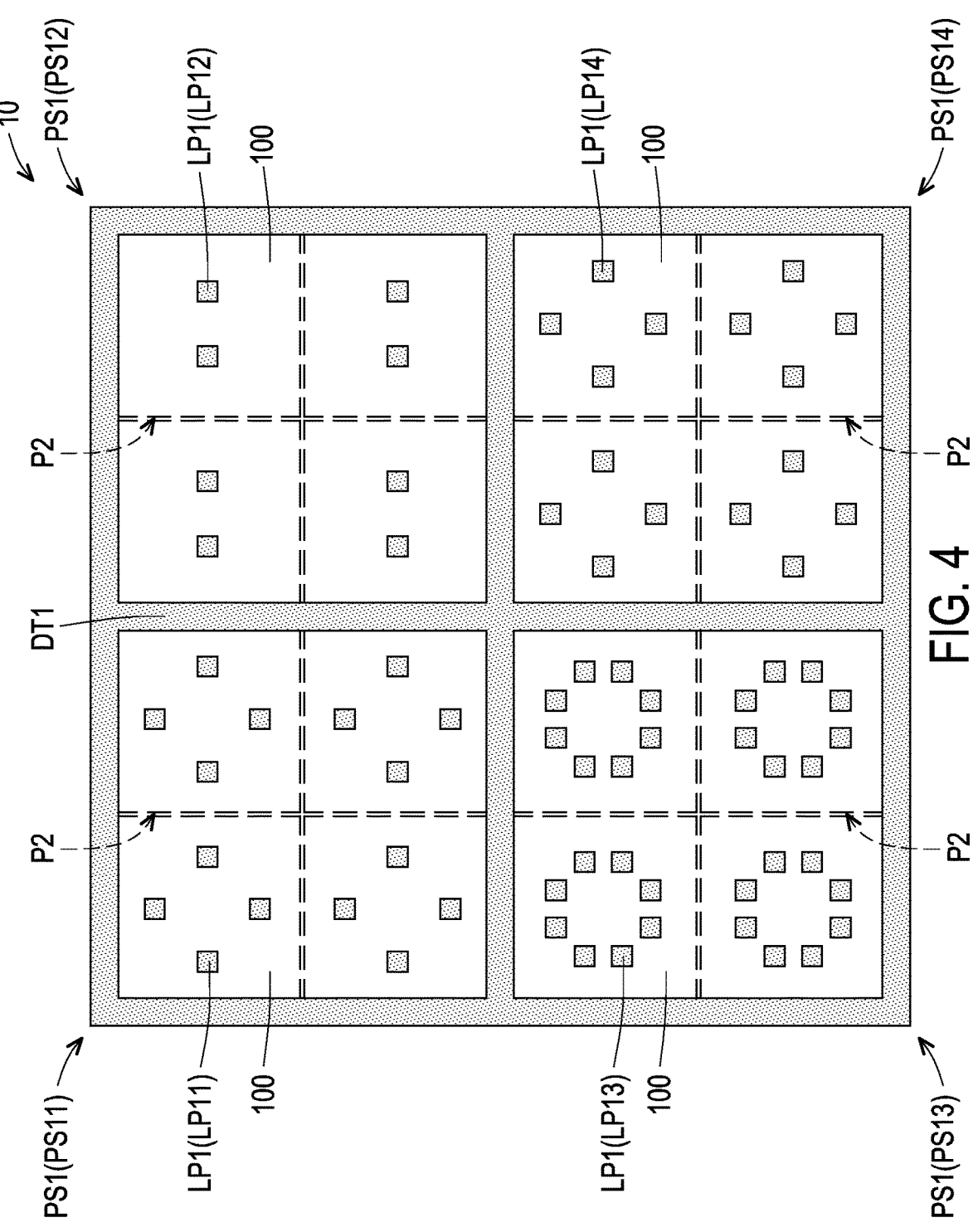
FIG. 4 is a top view of a BSI image sensor structure according to other embodiments of the invention.

FIG. 1A to FIG. 1H are cross-sectional views illustrating a manufacturing process of a BSI image sensor structure according to some embodiments of the invention. FIG. 2 is a top view of the BSI image sensor structure in FIG. 1H. FIG. 1A to FIG. 1H are cross-sectional views taken along section line I-I' in FIG. 2. In the top view of the present embodiment, some components in the cross-sectional view are omitted to clearly illustrate the configuration relationship between the components in the top view. FIG. 3A to FIG. 3F are top views of BSI image sensor structures according to other embodiments of the invention. FIG. 4 is a top view of a BSI image sensor structure according to other embodiments of the invention.

Figure 1A:
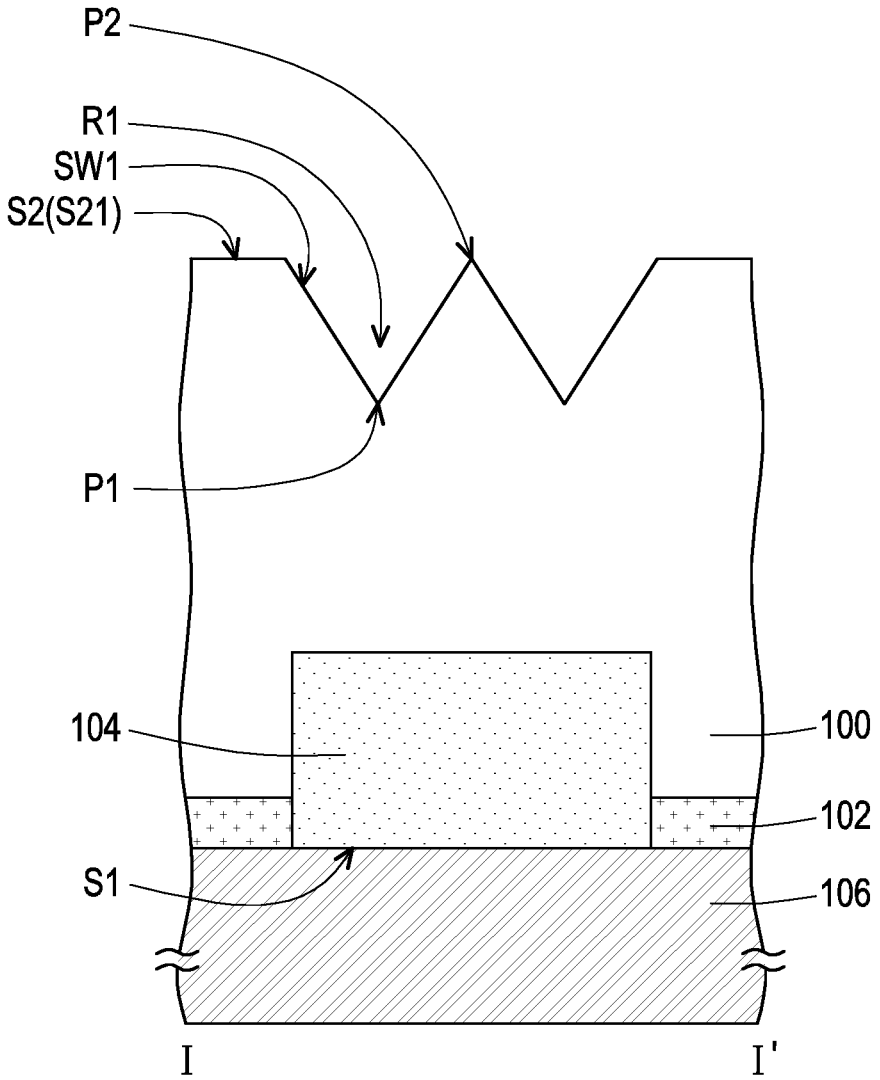
FIG. 1A to FIG. 1H are cross-sectional views illustrating a manufacturing process of a BSI image sensor structure according to some embodiments of the invention.

Referring to FIG. 1A, a substrate 100 is provided. The substrate 100 includes a first surface S1 and a second surface S2 opposite to each other. In the present embodiment, the first surface S1 may be the front side of the substrate 100, and the second surface S2 may be the backside of the substrate 100. In some embodiments, the substrate 100 may be a semiconductor substrate such as a silicon substrate. Furthermore, an isolation structure 102 may be formed in the substrate 100. The isolation structure 102 is adjacent to the first surface S1. In some embodiments, the isolation structure 102 is, for example, a shallow trench isolation (STI) structure. In some embodiments, the material of the isolation structure 102 is, for example, a dielectric material such as oxide (e.g., silicon oxide).

The light sensing device 104 is formed in the substrate 100. The light sensing device 104 is adjacent to the first surface S1. In some embodiments, the light sensing device 104 is, for example, a photodiode. In some embodiments, the method of forming the light sensing device 104 is, for example, an ion implantation method.

In addition, a device layer 106 may be formed on the first surface S1. In some embodiments, the device layer 106 may include required components such as active devices (e.g., transistor devices), dielectric layers, and/or interconnect structures, and the description thereof is omitted here.

At least one recess R1 is formed on the second surface S2. In addition, the number of the recesses R1 is not limited to the number shown in the figure. As long as the number of the recesses R1 is at least one, it falls within the scope of the invention. In the present embodiment, the number of the recesses R1 is, for example, plural, and the recesses R1 may form an inverted pyramid array (IPA) on the second surface S2. In some embodiments, the recess R1 may have a inclined sidewall SW1, and the bottom of the recess R1 may have a tip P1. In some embodiments, the second surface S2 may have a tip P2. In some embodiments, the second surface S2 may have a flat surface S21.

In some embodiments, the method of forming the recess R1 may include the following steps, but the invention is not limited thereto. First, a patterned hard mask layer (not shown) exposing a portion of the second surface S2 may be formed on the second surface S2. Then, a wet etching process is performed on the substrate 100 by using the patterned hard mask layer as a mask to form the recess R1. In addition, the flat surface S21 may be a portion of the second surface S2 covered by the patterned hard mask layer. In some embodiments, the etchant used in the wet etching process is, for example, tetramethylammonium hydroxide (TMAH). After the recess R1 is formed, the patterned hard mask layer may be removed.

Figure 1B:
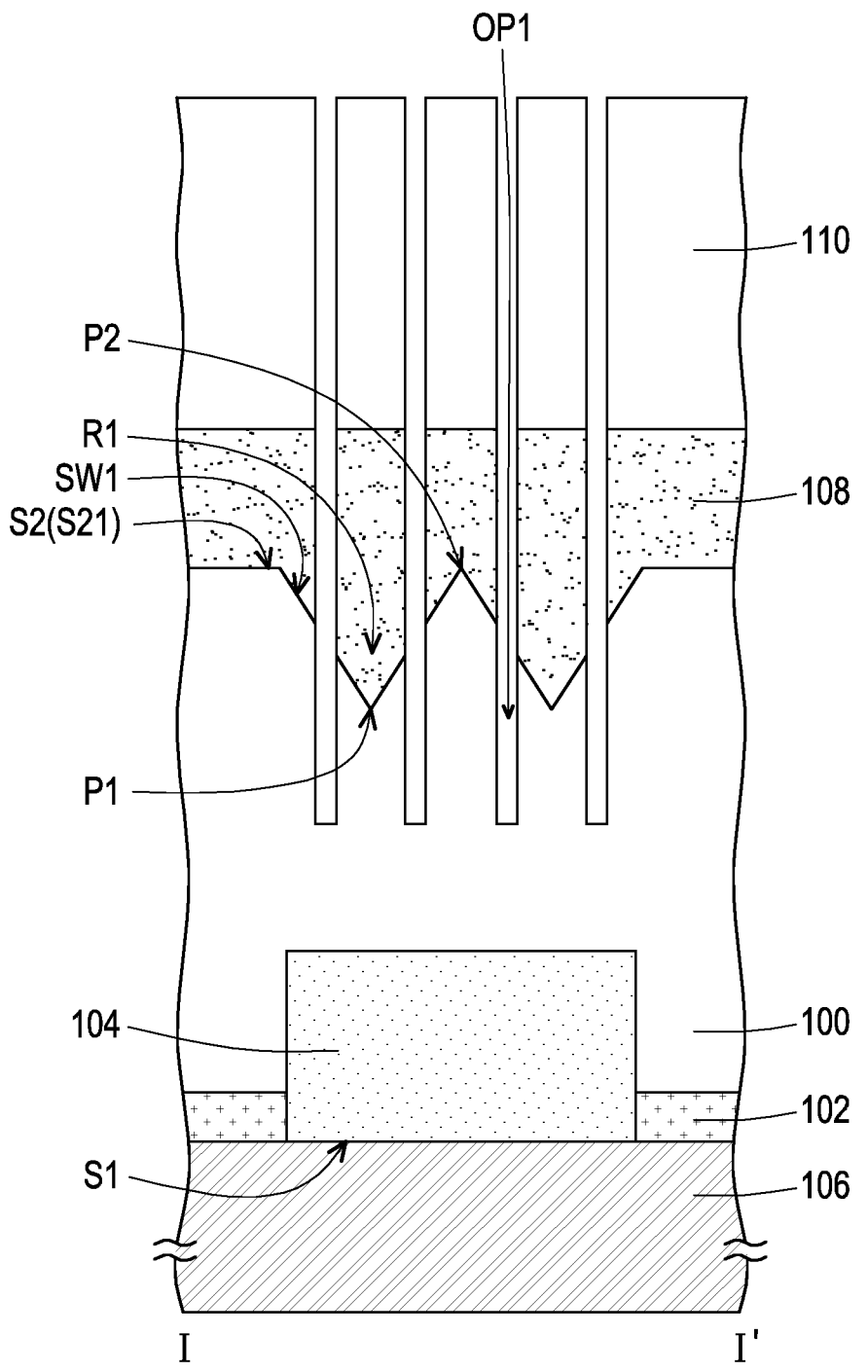

Referring to FIG. 1B, at least one opening OP1 may be formed in the substrate 100. The opening OP1 is located directly above the light sensing device 104. The opening OP1 may be connected to the recess R1. In addition, the number of the openings OP1 is not limited to the number shown in the figure. As long as the number of the openings OP1 is at least one, it falls within the scope of the invention.

In some embodiments, the method of forming the opening OP1 may include the following steps. First, a hard mask layer 108 is formed on the second surface S2. The hard mask layer 108 may fill the recess R1. In some embodiments, the material of the hard mask layer 108 is, for example, oxide (e.g., silicon oxide). In some embodiments, the method of forming the hard mask layer 108 is, for example, a chemical vapor deposition (CVD) method. Next, a patterned photoresist layer 110 may be formed on the hard mask layer 108. In some embodiments, the patterned photoresist layer 110 may be formed by a lithography process. Then, the hard mask layer 108 and the substrate 100 are patterned by using the patterned photoresist layer 110 as a mask to form the opening OP1. In some embodiments, a portion of the hard mask layer 108 and a portion of the substrate 100 are removed by using the patterned photoresist layer 110 as a mask to form the opening OP1. In some embodiments, the method of removing a portion of the hard mask layer 108 and a portion of the substrate 100 is, for example, a dry etching method.

Figure 1C:
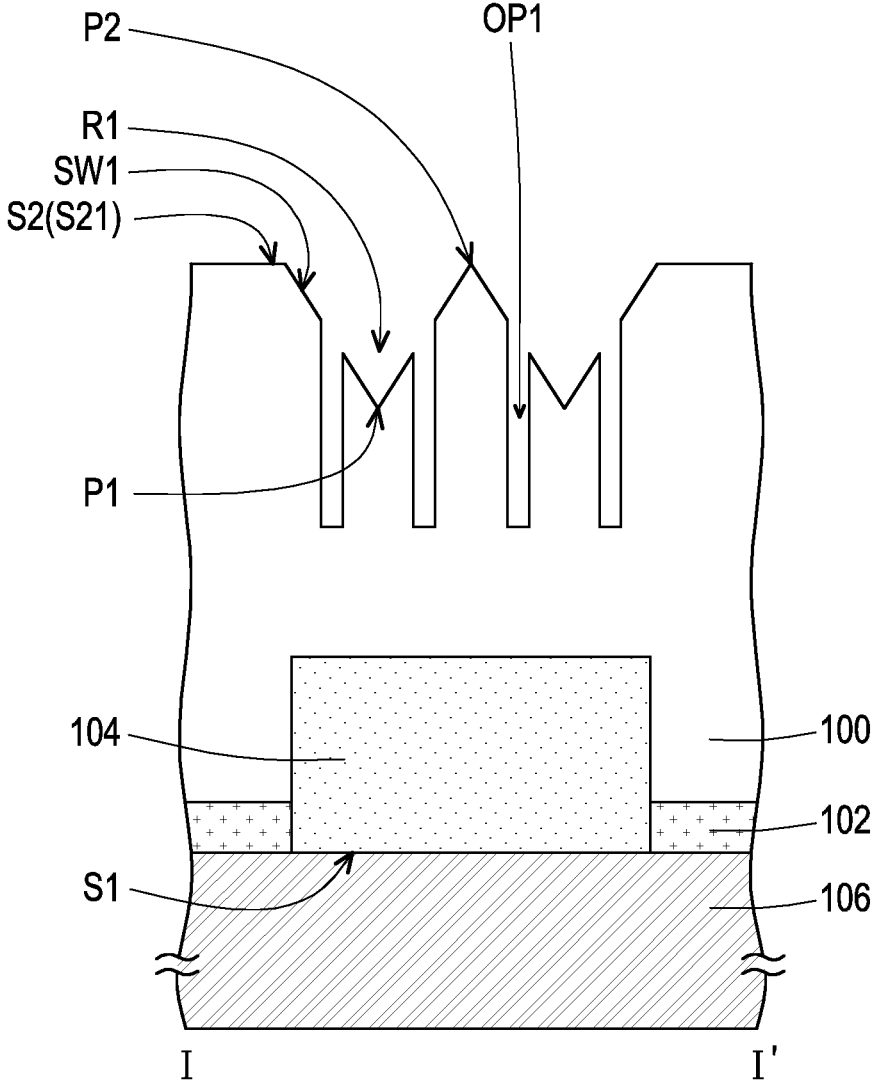

Referring to FIG. 1C, the patterned photoresist layer 110 may be removed. In some embodiments, the method of removing the patterned photoresist layer 110 is, for example, a dry stripping method or a wet stripping method. The hard mask layer 108 may be removed. In some embodiments, the method of removing the hard mask layer 108 is, for example, a wet etching method.

Figure 1D:
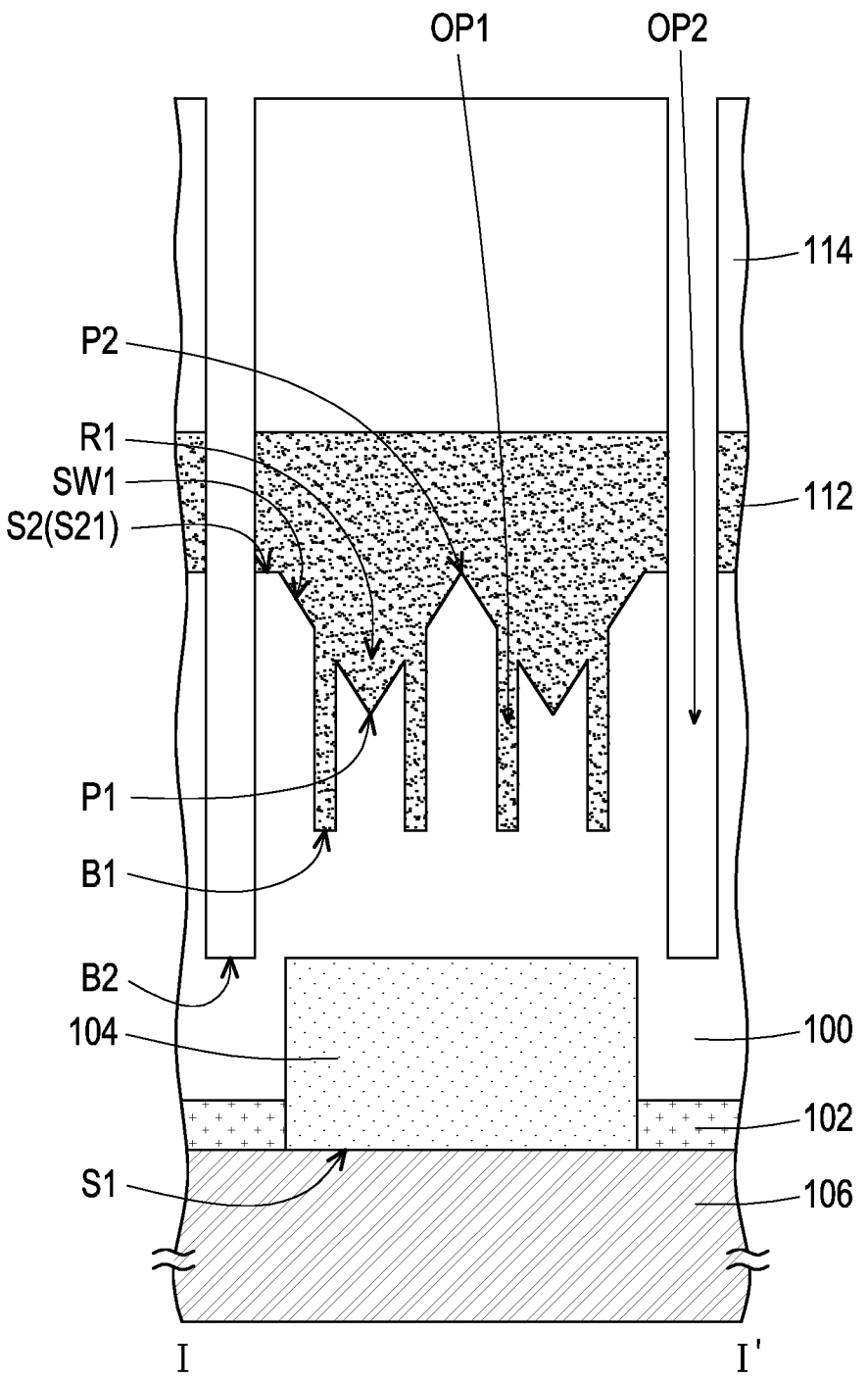

Referring to FIG. 1D, an opening OP2 may be formed in the substrate 100. The opening OP2 is located aside the light sensing device 104. In some embodiments, the opening OP2 may be a deep trench. The bottom B2 of the opening OP2 may be lower than the bottom B1 of the opening OP1. In some embodiments, the method of forming the opening OP2 may include the following steps. First, a hard mask layer 112 is formed on the second surface S2. The hard mask layer 112 may fill the recess R1 and the opening OP1. In some embodiments, the material of the hard mask layer 112 is, for example, oxide (e.g., silicon oxide). In some embodiments, the method of forming the hard mask layer 112 is, for example, a CVD method. Next, a patterned photoresist layer 114 may be formed on the hard mask layer 112. In some embodiments, the patterned photoresist layer 114 may be formed by a lithography process. Then, the hard mask layer 112 and the substrate 100 are patterned by using the patterned photoresist layer 114 as a mask to form the opening OP2. In some embodiments, a portion of the hard mask layer 112 and a portion of the substrate 100 are removed by using the patterned photoresist layer 114 as a mask to form the opening OP2. In some embodiments, the method of removing a portion of the hard mask layer 112 and a portion of the substrate 100 is, for example, a dry etching method.

Figure 1E:
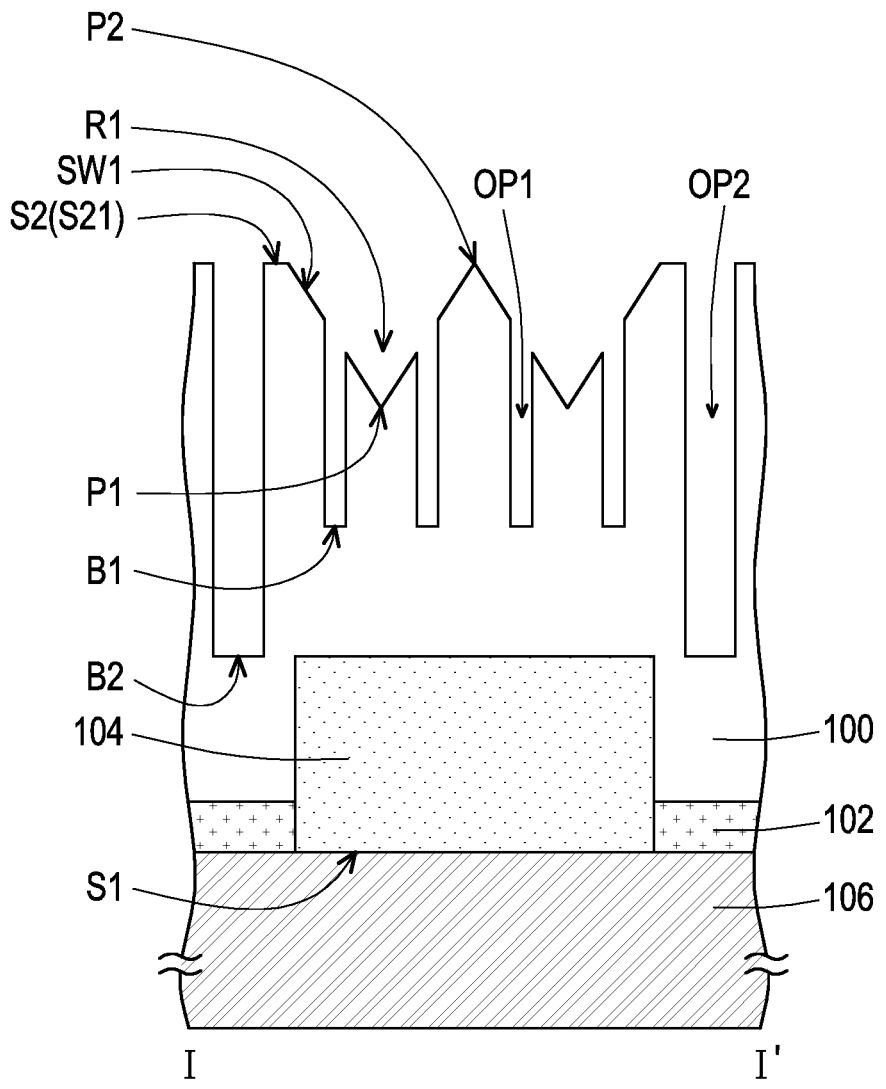

Referring to FIG. 1E, the patterned photoresist layer 114 may be removed. In some embodiments, the method of removing the patterned photoresist layer 114 is, for example, a dry stripping method or a wet stripping method. The hard mask layer 112 may be removed. In some embodiments, the method of removing the hard mask layer 112 is, for example, a wet etching method.

Figure 1F:
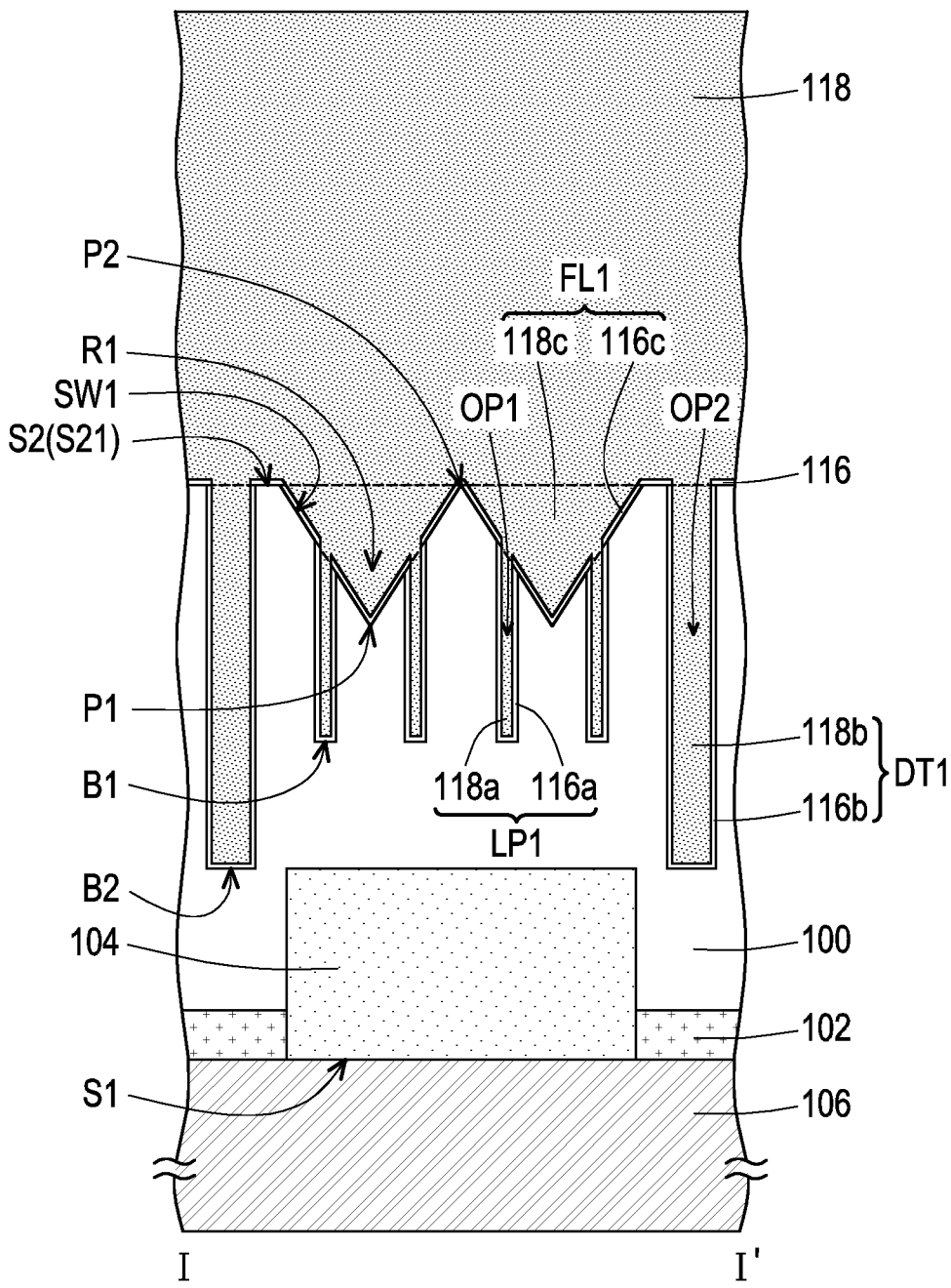

Referring to FIG. 1F, a passivation layer 116 may be conformally formed on the second surface S2. In some embodiments, the material of the passivation layer 116 is, for example, a high dielectric constant material. In some embodiments, the method of forming the passivation layer 116 is, for example, an atomic layer deposition (ALD) method.

A filling material layer 118 may be formed on the second surface S2. In some embodiments, the filling material layer 118 may be formed on the passivation layer 116. In some embodiments, the material of the filling material layer 118 is, for example, oxide (e.g., silicon oxide). In some embodiments, the method of forming the filling material layer 118 is, for example, a CVD method.

The filling material layer 118 may fill the opening OP1. Therefore, at least one light pipe structure LP1 may be formed in the substrate 100. The light pipe structure LP1 is located directly above the light sensing device 104. The light pipe structure LP1 may include a portion 118a of the filling material layer 118 located in the opening OP1. In some embodiments, the light pipe structure LP1 may further include a portion 116a of the passivation layer 116 located in the opening OP1. In addition, the number of the light pipe structures LP1 is not limited to the number shown in the figure. As long as the number of the light pipe structures LP1 is at least one, it falls within the scope of the invention.

Furthermore, the filling material layer 118 may fill the opening OP2. Therefore, a deep trench isolation structure DT1 may be formed in the substrate 100. The deep trench isolation structure DT1 is located aside the light sensing device 104. The deep trench isolation structure DT1 may include a portion 118b of the filling material layer 118 located in the opening OP2. In some embodiments, the deep trench isolation structure DT1 may further include a portion 116b of the passivation layer 116 located in the opening OP2.

In addition, the filling material layer 118 may fill the recess R1. Therefore, the filling layer FL1 may be formed in the recess R1. The filling layer FL1 may be connected to the light pipe structure LP1. The filling layer FL1 may include a portion 118c of the filling material layer 118 located in the recess R1. In some embodiments, the filling layer FL1 may further include a portion 116c of the passivation layer 116 located in the recess R1.

Figure 1G:
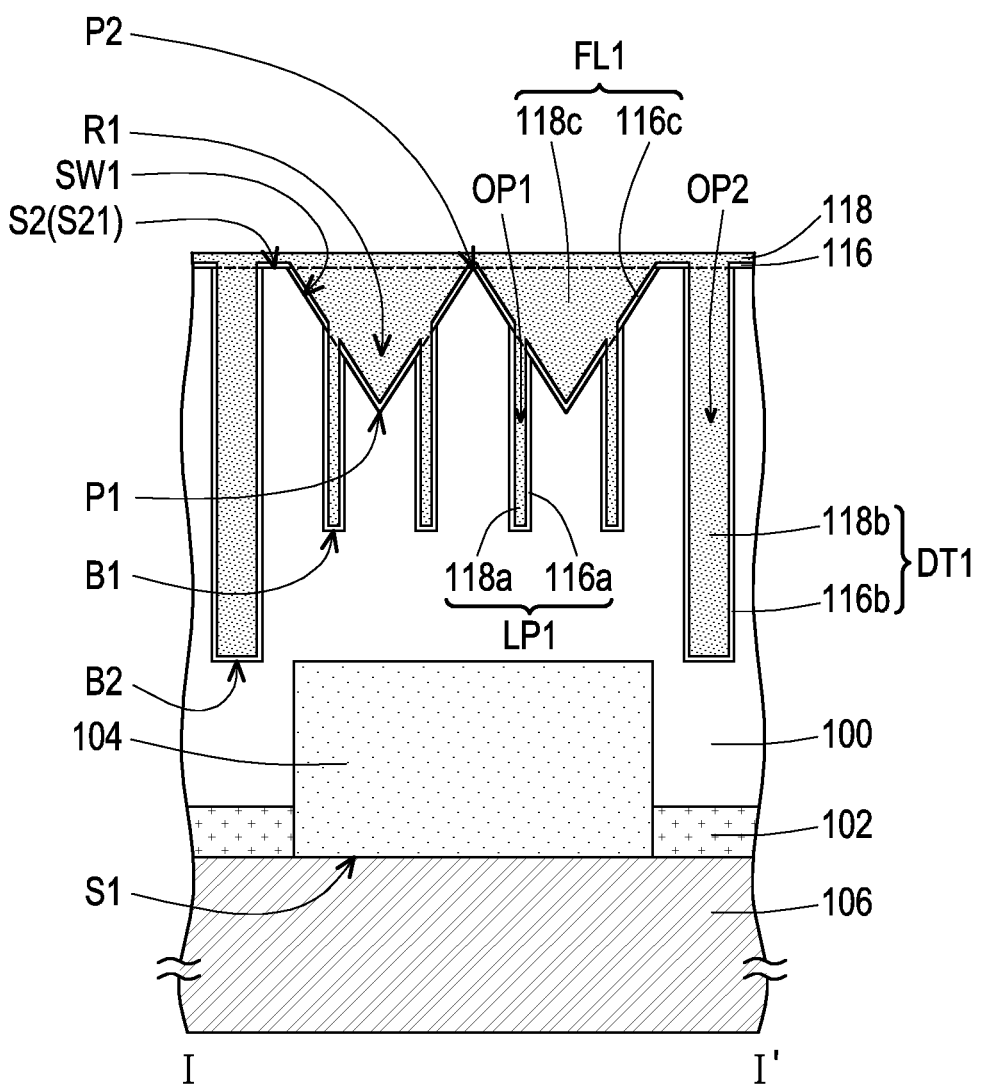

Referring to FIG. 1G, a planarization process may be performed on the filling material layer 118. Therefore, the filling material layer 118 may be planarized, and the thickness of the filling material layer 118 may be reduced. In some embodiments, the planarization process is, for example, a chemical mechanical polishing (CMP) process.

Figure 1H:
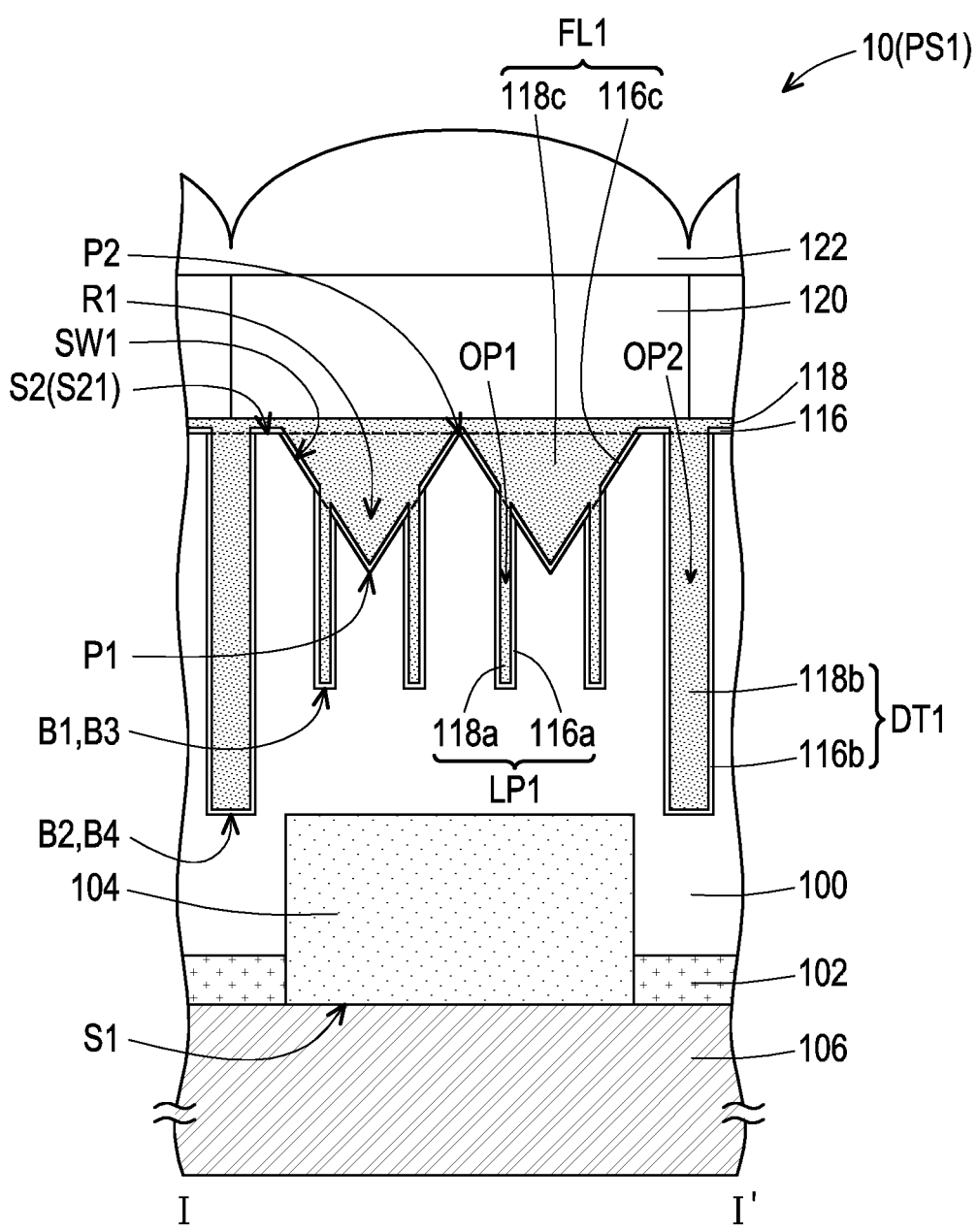

Referring to FIG. 1H, a color filter layer 120 may be formed on the second surface S2. In some embodiments, the color filter layer 120 may be formed on the filling material layer 118. The color filter layer 120 may be a red filter layer, a green filter layer, or a blue filter layer. A microlens layer 122 may be formed on the color filter layer 120. The method of forming the color filter layer 120 and the microlens layer 122 are well known to one of ordinary skill in the art, and the description thereof is omitted here.

Hereinafter, the BSI image sensor structure 10 of the present embodiment is described with reference to FIG. 1H and FIG. 2. In addition, although the method for forming the BSI image sensor structure 10 is described by taking the above method as an example, the invention is not limited thereto.

Referring to FIG. 1H and FIG. 2, the BSI image sensor structure 10 includes a pixel structure PS1. The pixel structure PS1 includes a substrate 100, a light sensing device 104, and at least one light pipe structure LP1. The substrate 100 includes a first surface S1 and a second surface S2 opposite to each other. The second surface S2 has at least one recess R1. In this way, the length of the optical path of the light in the substrate 100 can be increased by the recess R1. Therefore, the total amount of the long-wavelength light (e.g., red light) absorbed by the light sensing device 104 can be increased, thereby improving the quantum efficiency. In some embodiments, the second surface S2 may include an inverted pyramid array (IPA) structure. The light sensing device 104 is located in the substrate 100. The light sensing device 104 is adjacent to the first surface S1.

The light pipe structure LP1 is located in the substrate 100. The light pipe structure LP1 is located directly above the light sensing device 104. In this way, the length of the optical path of the light in the substrate 100 can be reduced by the light pipe structure LP1. Therefore, the total amount of the short-wavelength light (e.g., green light or blue light) absorbed by the light sensing device 104 can be increased, thereby improving the quantum efficiency. In some embodiments, the light pipe structure LP1 may extend from the second surface S2 toward the light sensing device 104. In some embodiments, the light pipe structure LP1 may extend from the corresponding recess R1 toward the light sensing device 104. In the present embodiment, the light pipe structure LP1 may extend from the sidewall SW1 of the corresponding recess R1 toward the light sensing device 104, but the invention is not limited thereto. In other embodiments, the light pipe structure LP1 may extend from the tip P1 of the corresponding recess R1 toward the light sensing device 104.

In some embodiments, the refractive index of the light pipe structure LP1 may be less than the refractive index of the substrate 100. When the refractive index of the light pipe structure LP1 is less than the refractive index of the substrate 100, the total reflection of the light entering the substrate 100 will occur at the interface between the substrate 100 and the light pipe structure LP1. Therefore, the total amount of the light absorbed by the light sensing device 104 can be increased, thereby improving the quantum efficiency.

The light pipe structure LP1 may be a single-layer structure or a multilayer structure. In the present embodiment, the light pipe structure LP1 is, for example, a multilayer structure, but the invention is not limited thereto. In the present embodiment, the light pipe structure LP1 may include a filling material layer 118 and a passivation layer 116. The filling material layer 118 is located in the substrate 100. The passivation layer 116 is located between the filling material layer 118 and the substrate 100. For example, the light pipe structure LP1 may include a portion 118a of the filling material layer 118 located in the opening OP1 and a portion 116a of the passivation layer 116 located in the opening OP1.

The pixel structure PS1 may further include a filling layer FL1 and a deep trench isolation structure DT1. In some embodiments, the light pipe structure LP1, the deep trench isolation structure DT1, and the filling layer FL1 may be integrally formed.

The filling layer FL1 fill the recess R1. The filling layer FL1 may be connected to the light pipe structure LP1. The filling layer FL1 may be a single-layer structure or a multilayer structure. In the present embodiment, the filling layer FL1 is, for example, a multilayer structure, but the invention is not limited thereto. In the present embodiment, the filling layer FL1 may include a filling material layer 118 and a passivation layer 116. For example, the filling layer FL1 may include a portion 118c of the filling material layer 118 located in the recess R1 and a portion 116c of the passivation layer 116 located in the recess R1.

The deep trench isolation structure DT1 is located in the substrate 100. The deep trench isolation structure DT1 is located aside the light sensing device 104. In some embodiments, the bottom B4 of the deep trench isolation structure DT1 may be lower than the bottom B3 of the light pipe structure LP1. The deep trench isolation structure DT1 may be a single-layer structure or a multilayer structure. In the present embodiment, the deep trench isolation structure DT1 is, for example, a multilayer structure, but the invention is not limited thereto. In the present embodiment, the deep trench isolation structure DT1 may include a filling material layer 118 and a passivation layer 116. For example, the deep trench isolation structure DT1 may include a portion 118b of the filling material layer 118 located in the opening OP2 and a portion 116b of the passivation layer 116 located in the opening OP2.

In some embodiments, the refractive index of the deep trench isolation structure DT1 may be less than the refractive index of the substrate 100. When the refractive index of the deep trench isolation structure DT1 is less than the refractive index of the substrate 100, the total reflection of the light entering the substrate 100 will occur at the interface between the substrate 100 and the deep trench isolation structure DT1. Therefore, the total amount of the light absorbed by the light sensing device 104 can be increased, thereby improving the quantum efficiency. In addition, the deep trench isolation structure DT1 can be used to prevent the optical crosstalk.

The pixel structure PS1 may further include a device layer 106. The device layer 106 is located on the first surface S1. In addition, the pixel structure PS1 may further include a color filter layer 120 and a microlens layer 122. The color filter layer 120 is located on the second surface S2. In some embodiments, the color filter layer 120 may be located on the filling material layer 118. The microlens layer 122 is located on the color filter layer 120.

In addition, the layout design of the light pipe structure LP1 (e.g., the shape, quantity, and arrangement of the light pipe structure LP1) is not limited to the layout design shown in FIG. 2. In some embodiments, the layout design of the light pipe structure LP1 may be the layout design as shown in any one of FIG. 3A to FIG. 3F. In the present embodiment, as shown in FIG. 2, the top-view pattern of the light pipe structure LP1 may be strip-shaped, but the invention is not limited thereto. In other embodiments, as shown in FIG. 3A to FIG. 3D, the top-view pattern of the light pipe structure LP1 may be block-shaped. In other embodiments, as shown in FIG. 3F, the top-view pattern of the light pipe structure LP1 may be ring-shaped. In some embodiments, as shown in FIG. 2 and FIG. 3A to FIG. 3F, when the number of the light pipe structures LP1 is plural, the light pipe structures LP1 may be arranged in a symmetrical manner.

In some embodiments, as shown in FIG. 4, the BSI image sensor structure 10 may include a plurality of the pixel structures PS1 (e.g., pixel structure PS11 to pixel structure PS14). In some embodiments, the regions of the pixel structures PS1 may be defined by the deep trench isolation structure DT1. In some embodiments, the layout design of the light pipe structure LP1 in each of the pixel structures PS1 may be optimally designed according to the type of the color filter layer 120 (e.g., red filter layer, green filter layer, or blue filter layer) in the pixel structure PS1. For example, the color filter layer 120 of the pixel structure PS11 and the color filter layer 120 of the pixel structure PS14 may be green filter layers, the color filter layer 120 of the pixel structure PS12 may be a red filter layer, and the color filter layer 120 of the pixel structure PS13 may be a blue filter layer, but the invention is not limited thereto.

In some embodiments, as shown in FIG. 4, the pixel structures PS1 (e.g., pixel structure PS11 and pixel structure PS14) may have the same light pipe structure layout. For example, in the pixel structure PS11 and the pixel structure PS14, the shape, quantity, and arrangement of the light pipe structure LP11 and the shape, quantity, and arrangement of the light pipe structure LP14 may be the same as each other.

In some embodiments, as shown in FIG. 4, the pixel structures PS1 (e.g., pixel structure PS11, pixel structure PS12, and pixel structure PS13) may have different light pipe structure layouts. For example, in the pixel structure PS11, the pixel structure PS12, and the pixel structure PS13, the quantity and arrangement of the light pipe structure LP11, the quantity and arrangement of the light pipe structure LP12, and the quantity and arrangement of the light pipe structure LP13 may be different from each other.

In addition, the details (e.g., the material and the forming method) of each component in the BSI image sensor structure 10 have been described in detail in the above embodiments, and the description thereof is not repeated here.

Based on the above embodiments, in the BSI image sensor structure 10 and the manufacturing method thereof, the substrate 100 includes the first surface S1 and the second surface S2 opposite to each other. The second surface S2 (e.g., backside) of the substrate 100 has at least one recess R1. The light sensing device 104 is located in the substrate 100. The light sensing device 104 is adjacent to the first surface S1. The light pipe structure LP1 is located in the substrate 100. The light pipe structure LP1 is located directly above the light sensing device 104. Therefore, the quantum efficiency of the BSI image sensor structure 10 can be effectively improved.

In summary, in the BSI image sensor structure and the manufacturing method thereof of the aforementioned embodiments, the substrate includes a first surface and a second surface opposite to each other. The second surface (e.g., backside) has at least one recess. The light sensing device is located in the substrate. The light sensing device is adjacent to the first surface. The light pipe structure is located in the substrate. The light pipe structure is located directly above the light sensing device. Therefore, the quantum efficiency of the BSI image sensor structure can be effectively improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A backside illuminated (BSI) image sensor structure, comprising a pixel structure, wherein the pixel structure comprises:

a substrate comprising a first surface and a second surface opposite to each other, wherein the second surface has at least one recess;

a light sensing device located in the substrate and adjacent to the first surface; and at least one light pipe structure located in the substrate and located directly above the light sensing device, wherein the light pipe structure comprises:

a filling material layer located in the substrate; and a passivation layer located between the filling material layer and the substrate.

2. The BSI image sensor structure according to claim 1, wherein the light pipe structure extends from the second surface toward the light sensing device.

3. The BSI image sensor structure according to claim 1, wherein the light pipe structure extends from the corresponding recess toward the light sensing device.

4. The BSI image sensor structure according to claim 1, wherein the second surface comprises an inverted pyramid array structure.

5. The BSI image sensor structure according to claim 1, wherein a refractive index of the light pipe structure is less than a refractive index of the substrate.

6. The BSI image sensor structure according to claim 1, wherein the pixel structure further comprises:

a filling layer filling the recess and connected to the light pipe structure; and a deep trench isolation structure located in the substrate and located aside the light sensing device.

7. The BSI image sensor structure according to claim 6, wherein the light pipe structure, the deep trench isolation structure, and the filling layer are integrally formed.

8. The BSI image sensor structure according to claim 6, wherein a bottom of the deep trench isolation structure is lower than a bottom of the light pipe structure.

9. The BSI image sensor structure according to claim 6, wherein a refractive index of the deep trench isolation structure is less than a refractive index of the substrate.

10. The BSI image sensor structure according to claim 1, wherein the pixel structure further comprises:

a device layer located on the first surface.

11. The BSI image sensor structure according to claim 1, wherein the pixel structure further comprises:

a color filter layer located on the second surface; and a microlens layer located on the color filter layer.

12. The BSI image sensor structure according to claim 1, comprising a plurality of the pixel structures, wherein the plurality of the pixel structures have the same light pipe structure layout.

13. The BSI image sensor structure according to claim 1, comprising a plurality of the pixel structures, wherein the plurality of the pixel structures have different light pipe structure layouts.

14. A manufacturing method of a BSI image sensor structure, comprising:

providing a substrate, wherein the substrate comprises a first surface and a second surface opposite to each other;

forming a light sensing device in the substrate, wherein the light sensing device is adjacent to the first surface;

forming at least one recess on the second surface; and forming at least one light pipe structure in the substrate, wherein the light pipe structure is located directly above the light sensing device, and the light pipe structure comprises:

a first portion of a filling material layer located in the substrate; and a first portion of a passivation layer located between the filling material layer and the substrate.

15. The manufacturing method of the BSI image sensor structure according to claim 14, further comprising:

forming a deep trench isolation structure in the substrate, wherein the deep trench isolation structure is located aside the light sensing device; and forming a filling layer in the recess, wherein the filling layer is connected to the light pipe structure.

16. The manufacturing method of the BSI image sensor structure according to claim 15, wherein a method of forming the light pipe structure, the deep trench isolation structure, and the filling layer comprises:

forming at least one first opening in the substrate, wherein the first opening is located directly above the light sensing device and is connected to the recess;

forming a second opening in the substrate, wherein the second opening is located aside the light sensing device; and forming the filling material layer on the second surface, wherein the filling material layer fills the first opening, the second opening, and the recess, the light pipe structure comprises the first portion of the filling material layer located in the first opening, the deep trench isolation structure comprises a second portion of the filling material layer located in the second opening, and the filling layer comprises a third portion of the filling material layer located in the recess.

17. The manufacturing method of the BSI image sensor structure according to claim 16, further comprising:

performing a planarization process on the filling material layer.

18. The manufacturing method of the BSI image sensor structure according to claim 16, wherein the method of forming the light pipe structure, the deep trench isolation structure, and the filling layer further comprises:

conformally forming the passivation layer on the second surface, wherein the filling material layer is formed on the passivation layer, the light pipe structure further comprises the first portion of the passivation layer located in the first opening, the deep trench isolation structure further comprises a second portion of the passivation layer located in the second opening, and the filling layer further comprises a third portion of the passivation layer located in the recess.

19. The manufacturing method of the BSI image sensor structure according to claim 14, further comprising:

forming a device layer on the first surface;

forming a color filter layer on the second surface; and forming a microlens layer on the color filter layer.

\*   \*   \*   \*   \*